United States Patent [19]

DiIorio

[11] Patent Number: 5,250,897
[45] Date of Patent: Oct. 5, 1993

[54] SOLENOID/SLUG GAP MEASUREMENT TOOL FOR SEMICONDUCTOR EQUIPMENT AND METHOD OF MEASUREMENT

[75] Inventor: Salvatore P. DiIorio, Campbell, Calif.

[73] Assignee: LSI Logic Corporation, Milpitas, Calif.

[21] Appl. No.: 879,476

[22] Filed: May 7, 1992

[51] Int. Cl.⁵ .................. G01B 7/14; H01L 21/306
[52] U.S. Cl. .................. 324/207.16; 156/627; 324/207.24; 324/226
[58] Field of Search ............ 324/207.16, 207.24, 324/207.26, 226, 229, 415; 156/627

[56] References Cited

U.S. PATENT DOCUMENTS 4,849,666  7/1989  Hoad ................... 324/207.16 X
4,907,901  3/1990  Mitchell .............. 324/207.16 X Primary Examiner—Gerard R. Strecker
Attorney, Agent, or Firm—Townsend and Townsend Khourie and Crew

[57] ABSTRACT

A tool for measuring a gap between two plates for processing semiconductor wafers is provided. The tool has a solenoid for placement upon a first of the two plates. In the hollow cylinder of the solenoid a slug containing a magnet is mounted so that the slug can slide along the axis of the solenoid. The solenoid is connected to an electric circuit to drive an electrical current therethrough to displace the slug toward and into contact with the second plate. An ammeter measures the current through the solenoid. The measured current corresponds to the slug displacement and yields a measurement of the gap between said two plates.

13 Claims, 1 Drawing Sheet

SOLENOID/SLUG GAP MEASUREMENT TOOL FOR SEMICONDUCTOR EQUIPMENT AND METHOD OF MEASUREMENT

BACKGROUND OF THE INVENTION

The present invention relates to tool fixtures for measuring gaps between plates and, more particularly, to tool fixtures for measuring gaps between plates used in processing semiconductor wafers.

Semiconductor equipment typically require readjustments or recalibration, after a specified number of process runs through the equipment. The manufacturing process is interrupted, the equipment opened, and the adjustments and recalibration made. As one can imagine, these interruptions are inconvenient and costly in terms of manufacturing "down time."

One such piece of semiconductor equipment, is a parallel-plate plasma etcher. After a number of wafers are processed in such etchers, the distance, or gap, between the two parallel plates which form the electrodes generating the etching plasma must be recalibrated. The equipment must be opened, the plate gap recalibrated, the equipment reassembled, and enclosed before normal operations can resume.

The present invention, on the other hand, allows the gap between the plates to be recalibrated without opening the equipment assembly. Furthermore, the present invention permits the gap to be determined easily and very quickly.

SUMMARY OF THE INVENTION

The present invention provides for a tool for measuring a gap between two plates for processing semiconductor wafers. The tool has a solenoid for placement upon a first of the two plates. In the hollow cylinder of the solenoid a slug containing a magnet is mounted so that the slug can slide along the axis of the solenoid. The solenoid is connected to an electric circuit to drive an electrical current therethrough to displace the slug toward and into contact with the second plate. An ammeter measures the current through the solenoid. The measured current corresponds to the slug displacement and yields a measurement of the gap between said two plates.

DETAILED DESCRIPTION OF SPECIFIC EMBODIMENT(S)

Figure 1:
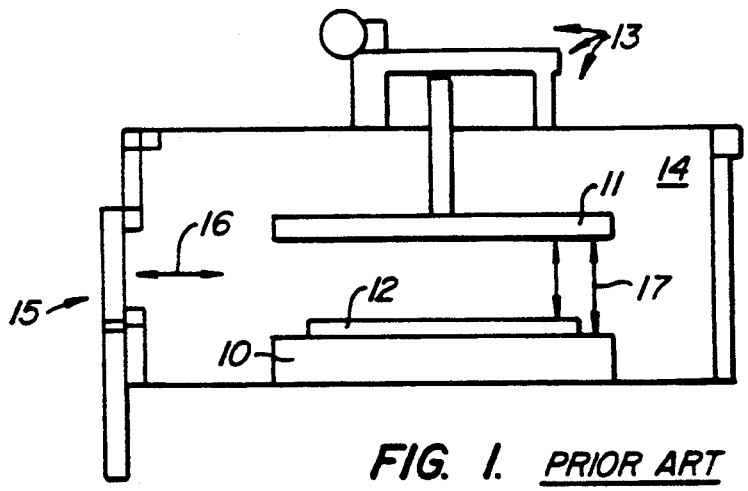
FIG. 1 is a representative cross-sectional view of a gap assembly of a parallel-plate plasma etcher.

FIG. 1 is a representative cross-sectional view of the gap assembly of a parallel plate plasma etcher. The assembly has a chamber 14 in which are located a lower plate 10 and upper plate 11. The two plates 10 and 11 are connected to electrical circuitry (not shown) to generate the high electrical fields between the plates of 10 and 11 necessary for a plasma. Assembly 13 symbolically indicates the mechanism which adjusts the position of the upper plate 11 and hence the gap between the two plates 10 and 11. A semiconductor wafer 12 is placed on the lower electrode 10 for etching. Loading and unloading of the wafer 12 is performed by a wafer handling mechanism (not shown) through a load/lock door assembly 15 which seals the chamber 14 upon closing. An arrow 16 indicates the path of the wafer 12 for loading and unloading.

Typically after a few hundred wafers are processed by the plasma etcher, the gap, the distance between the electrodes 10 and 11 indicated by an arrow 17, is out of specification. Presently, the main seal of the head assembly must be opened and the etcher disassembled. Clay balls are placed on the lower electrode 10 and the etcher reassembled. Then the gap is set to the specified height. The system is then opened and the clay balls which have been compressed by the two plates 10 and 11 are measured to check the gap. This gap recalibration method is inconvenient and time consuming.

Figure 2:
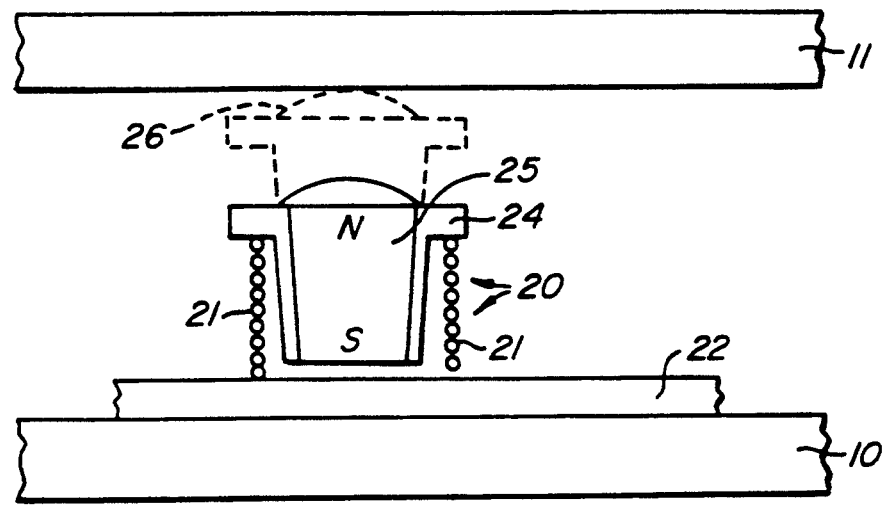
FIG. 2 is a cross-sectional view of one embodiment of the present invention.

The present invention provides for a much more convenient and easy recalibration of the gaps between parallel plates 10 and 11 As shown in FIG. 2, the present invention has a base plate 22 upon which is fixed a coiled wire 20 with an axis perpendicular to the base plate 22. The wire coil 20 forms a solenoid 21. Into the hollow of the solenoid 21 is placed a slug 24 containing a magnet 25. The magnet 25 is aligned along the vertical axis of the solenoid 21 so that an electric current through the wire 20 exerts a force along the center axis of the solenoid 21. The force on the magnet causes the slug 24 to rise.

The base plate 22, the solenoid 21 and slug 24 are placed between the plates 10 and 11 of the plasma etcher. The solenoid 21 is dimensioned to fit within the gap of the electrodes 10 and 11, which are typically about ¼-inch. Voice coils in audio speakers have been found to work suitably. Copper wire, gauge 28, wrapped around a treated hollow paper cylinder of 0.5 inches in diameter, to a length of 0.25 inches have been found to also be suitable. With such a coil, slugs from audio speakers typically found in stereo systems work effectively.

To drive the current through the solenoid 21, a power supply, such as a HP6205C from Hewlett-Packard Corporation of Palo Alto, Calif., can be used. Ammeters with milliampere ranges, such as Model 8050A from John Fluke Mfg. Co. of Everett, Wash., can satisfactorily measure the current.

When the base 22 is placed on the lower plate 10, an electric current through the solenoid 21 causes the slug 24 to rise until it contacts the upper electrode 11. The displaced slug 24 is shown by dotted lines in FIG. 2. It has been found that the amount of displacement of the slug is directly and linearly related to the amount of current through the coil. The slug or armature 24 does not extend completely through the coil 21. It is evident that as the slug 24 rises, less of the slug remains in the coil. Therefore, less of the slug is affected by the magnetic field of the coil and there is less force to work against the restraining force of gravity, the weight of the slug. As the current through the coil 21 increases, the magnetic field increases. More of the slug 24 is pushed out of the coil, i.e., the more the slug 24 is displaced. Hence there is a direct relationship between the strength of the magnetic field, i.e., the current through the coil 21, and the displacement of the slug upwards. Thus, the gap between the electrodes 10 and 11 can be determined by the sum of the thickness of the base plate 22, the height of the top of the slug at rest on the base plate 22, and the displacement of the slug when it contacts the upper electrode 11.

Furthermore, a bubble switch 26 can be mounted to the top of the slug 24 to indicate when the slug 24 is in contact with the upper electrode 11. The bubble switch 26 can be connected to an indicator, such as a light, which turns on when the switch 26 is in contact with the upper plate 11. Since there is a direct and linear relationship between the amount of current through the coil 21 and the displacement of the slug 24, the amount of current at that point indicates the displacement of the slug and the gap between the two plates. It should be understood, of course, that a calibration between coil current and slug displacement has first been made. It should be noted that the base plate 22 is relatively small so that the wafer handling mechanism of the plasma etcher can insert the tool fixture of the present invention through the load/lock door assembly 15. In fact, a semiconductor wafer may be used as the base plate 22.

Figure 3:
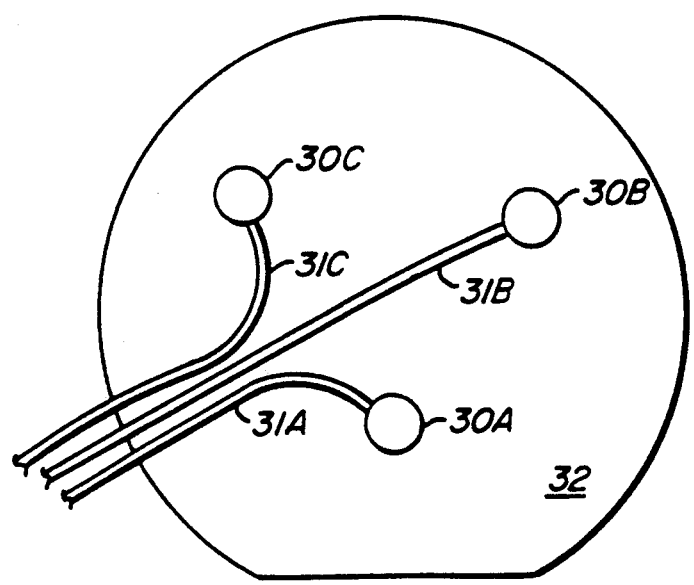
FIG. 3 is a top view of another embodiment of the present invention.

FIG. 3 illustrates a tool fixture with a semiconductor wafer 32. Three coil and slug assemblies 30a, 30b and 30c are mounted on the wafer 32 to form a triangular configuration. Each of the assemblies 30a-30c have respective wires 31a-31c to drive each coil and to monitor the bubble switch. The wafer 32 is placed on a wafer handling mechanism of a plasma etcher for placement into the gap assembly. The electrode adjustment assembly 13 moves the upper plate 11 to the specified distance and the three coil and slug assemblies 30a-30c can quickly determine whether the gap between the plates 10 and 11 are correct and whether the plates are parallel to each other.

All the above is a complete description of the preferred embodiments of the invention, various alternatives modifications and equivalents may be used. It should be evident that the present invention is equally applicable by making appropriate modifications to the embodiment described above. For example, the present invention has been described in the context of a parallel plate plasma etcher, but it is readily evident that it could be used to measure the gap between the plates of other semiconductor process equipment. Therefore, the above description should not be taken as limiting the scope of the invention which is defined by the metes and bounds of the appended claims.

What is claimed is:

1. A tool for measuring a gap between two parallel plates for processing semiconductor wafers, said tool comprising
   a base plate for placement on a first of said two plates and between said two plates;
   a wire cylindrically coiled around an axis perpendicular to a base plate;
   a slug containing a magnet, said slug slidably mounted within said coil along said axis;
   means connected to said wire coil for driving an electrical current therethrough and displacing said slug toward and in contact with said second plate; and
   means connected to said wire coil for measuring said current through said wire coil when the slug contacts said second plate;
   whereby the amount of said measured current corresponds to a slug displacement and a gap between said two plates.

2. A tool as in claim 1 wherein said base plate comprises a semiconductor wafer.

3. A tool as in claim 1 wherein said slug has an end for contacting said second plate and said tool further comprises means mounted at said end and connected to said measuring means for indicating when said end contacts said second plate.

4. A tool as in claim 3 wherein said indicating means comprises a bubble switch.

5. A tool for measuring a gap between two plates for processing semiconductor wafers, said tool comprising
   a semiconductor wafer for placement upon a first of said two plates;
   a first solenoid mounted upon said semiconductor wafer, said solenoid having a longitudinal axis perpendicular to said semiconductor wafer;
   an armature having a magnet, said armature slidably mounted within said solenoid for movement along said axis;
   means connected to said solenoid for driving an electrical current therethrough and displacing said armature into contact with a second plate of said two plates; and
   means connected to said solenoid for measuring said current through said solenoid when said armature contacts said second plate;
   whereby the amount of current indicated by said measuring means corresponds to the amount of armature displacement for a measurement of a gap between said two plates.

6. A tool as in claim 5 further comprising second and third solenoids, said solenoids mounted upon said wafer such that said second and third solenoids do not form a line with said first solenoid on said wafer.

7. A tool as in claim 5 wherein said armature has an end for contacting said second plate, said tool further comprising means mounted at said armature end for indicating when said armature end contacts said second plate.

8. A tool as in claim 7 wherein said indicating means comprises a bubble switch.

9. A method of measuring a gap between two plates for processing semiconductor wafers, said method comprising
   placing a solenoid on a first of said two plates;
   driving an electric current through said solenoid;
   displacing an armature slidably mounted within said solenoid responsive to said electric current through said solenoid so that said armature contacts a second of said two plates;
   measuring said electric current through said solenoid when said armature contacts said second plate;
   determining the displacement of said armature from said electric current measurement;
   and obtaining a measure of a gap between said two plates from the armature displacement.

10. The method as in claim 9 further comprising the step of mounting said solenoid upon a base plate, and placing said base plate upon said first of said two plates.

11. The method as in claim 10 wherein said base plate comprises a semiconductor wafer.

12. The method of claim 10 wherein said solenoid mounting step further comprises mounting second and third solenoids upon said base plate such that said second and third solenoids do not form a lien with said first solenoid on said base plate.

13. The method of claim 9 further comprising placing second and third solenoids on said first plate, such that said second and third solenoids do not form a line with said first solenoid, and performing said driving displacing, measuring and determining steps with respect to said second and third solenoids.

* * * * *

UNITED STATES PATENT AND TRADEMARK OFFICE
CERTIFICATE OF CORRECTION

PATENT NO. : 5,250,897
DATED : 10-5-93
INVENTOR(S) : Salvatore DiIORIO

It is certified that error appears in the above-indentified patent and that said Letters Patent is hereby corrected as shown below:

On the title page, Item [75], iventor's name "DiLorio" should be --DiIorio--.

Signed and Sealed this

Eleventh Day of October, 1994

Attest:

BRUCE LEHMAN

*Attesting Officer*  *Commissioner of Patents and Trademarks*